United States Patent [19]

Barstow

[11] Patent Number: 4,580,108

[45] Date of Patent: Apr. 1, 1986

[54] TUNABLE WAVEGUIDE OSCILLATOR

[75] Inventor: John S. Barstow, Buxton, England

[73] Assignee: U.S. Philips Corporation, New York, N.Y.

[21] Appl. No.: 552,634

[22] Filed: Nov. 16, 1983

[30] Foreign Application Priority Data

Dec. 1, 1982 [GB] United Kingdom ................. 8234240

[51] Int. Cl.$^4$ .............................................. H03B 7/14
[52] U.S. Cl. ................................... 331/96; 331/107 R
[58] Field of Search ..................... 331/96, 101, 107 R, 331/107 DP

[56] References Cited

U.S. PATENT DOCUMENTS 4,280,110  7/1981  Cachier et al. ............... 331/107 DP
4,502,023  2/1985  Heitzmann ................... 331/107 DP Primary Examiner—Eugene LaRoche
Assistant Examiner—G. Wan
Attorney, Agent, or Firm—Robert J. Kraus

[57] ABSTRACT

An oscillator formed in a rectangular waveguide (1) with both mechanical and electronic tuning comprises an oscillator device (4) spaced from a movable short-circuit termination (2) with a varactor diode (5) therebetween, the effective electrical spacing between the oscillator device (4) and the varactor (5) being approximately an integral number of half-wavelengths at the operating frequency. The varactor (5) extends into the waveguide (1) from one broad wall thereof and engages a transverse member (10) extending between the narrow walls so that only part of the height of the waveguide (1) at that region is obscured. This enables the operating frequency and hence the extent of coupling of the varactor (5) to the oscillator cavity, and thus the electronic tuning range, to be varied by adjusting the position of the short-circuit (2). To enable the operating frequency to be mechanically adjusted without greatly influencing the electronic tuning range, and E-plane stub (11) with a movable short-circuit termination (12) may be branched from the waveguide (1) at the same region as the varactor (5).

10 Claims, 5 Drawing Figures

TUNABLE WAVEGUIDE OSCILLATOR

BACKGROUND OF THE INVENTION

The invention relates to a waveguide oscillator with both electrical and mechanical means for altering the operating characteristics of the oscillator.

Such oscillators are widely used in microwave technology. A typical oscillator of this kind comprises mechanical means to provide a coarse adjustment of the operating frequency of the oscillator and a tuning varactor to provide a fine adjustment of the operating frequency and/or for frequency modulation.

Oscillators with both mechanical and electronic tuning are discussed in the paper "Analytic Model for Varactor-Tuned Waveguide Gunn Oscillators" by A. S. Templin and R. L. Gunshor, *IEEE Transactions on Microwave Theory and Techniques*, Vol. MTT-22, No. 5 (May 1974), pp 554–556. This paper presents the results of calculations (using two different theoretical models) and experimental data for two oscillator configurations each comprising a length of full-height X-band waveguide containing a Gunn diode and a varactor diode spaced along the waveguide from one another and from a movable short-circuit termination at one end of the waveguide; each of the diodes is coupled to the waveguide with a respective mounting post. In one oscillator configuration ("case 1"), the Gunn diode is longitudinally intermediate the varactor diode and the short-circuit, while in the other ("case 2") the converse applies. In each case, the range of electronic tuning obtainable with a change in varactor bias is dependent on the position of the short-circuit. In case 1 (Gunn diode closer than the varactor diode to the short-circuit), wherein the centre frequency of the oscillator is said to be primarily determined by the spacing between the Gunn diode mounting post and the short-circuit, the oscillator has a very wide mechanical tuning range (8.5–12.0 GHz) but the electronic tuning range is critically dependent on the position of the short-circuit and is very small (less than 10 MHz). In case 2 (varactor diode closer than the Gunn diode to the short-circuit), wherein the centre frequency is said to be primarily determined by the spacing between the Gunn device mount and the varactor mounting post, the electronic tuning range varies with the position of the short-circuit in a fairly regular manner from zero up to a somewhat larger maximum value of 50–70 MHz, but the mechanical tuning range is much smaller than in case 1.

SUMMARY OF THE INVENTION

It is an object of the invention to provide an improved tunable waveguide oscillator.

According to the invention, a tunable waveguide oscillator comprises an elongate portion of rectangular waveguide having a termination at one end, a negative-resistance oscillator device disposed along the portion of waveguide and spaced from said one end, means comprising a varactor diode for presenting an electrically variable reactance in the waveguide at a region thereof longitudinally between the oscillator device and the termination, and means for mechanically altering the effective electrical spacing, in terms of the wavelength in the waveguide at the operating frequency of the oscillator, between the oscillator device and said region wherein in operation said spacing is approximately an integral number of half wavelengths, and wherein the variable reactance means extends into the waveguide over only part of the height of the waveguide at said region, measured perpendicular to the broad walls of the waveguide.

Important considerations on which the invention is based are:

(a) The varactor should be coupled to the waveguide in such a manner that the oscillator device (which is further than the variable reactance means from the termination) can still "see" the termination, so that the operating frequency of the oscillator (without varactor tuning) need not be primarily determined by the spacing between the oscillator device and said region at which the varactor is coupled to the waveguide.

(b) The effective electrical spacing between said region and the oscillator device should be fairly close to an integral multiple of half-wavelengths. (It is generally desirable to make the oscillator cavity as short as possible, and this multiple will therefore usually be one.) When this effective electrical spacing has a value which is an exact integral number of half-wavelengths, the variable reactance means will be situated at a minimum in the electromagnetic fields in the waveguide and should therefore have substantially no effect on the operating frequency. As the spacing is progressively altered mechanically from this value, the varactor will be coupled to the electromagnetic fields to a progressively greater extent and hence the electronic tuning range should progressively increase.

Suitably, said termination and said means for mechanically altering said spacing comprise a movable short-circuit at said end. The effective electrical spacing between the oscillator device and the short-circuit will then generally be an integral multiple (two or more) of half-wavelengths at the operating frequency. An alteration in the position of the short-circuit will tend to maintain this condition by altering the operating frequency, thus varying the effective electrical spacing between said region and the oscillator device in terms of the wavelength at the operating frequency and hence the extent of coupling between the varactor and the electromagnetic fields and consequently the electronic tuning range. The electronic tuning range and the operating frequency are then inter-related.

The varactor diode may extend into the waveguide away from one broad wall thereof and the variable reactance means may further comprise a member providing an electrically conductive connection to a terminal of the varactor diode remote from said one broad wall and extending transversely to the waveguide from said terminal to at least one of the narrow walls of the waveguide.

Suitably, said member extends substantially parallel to the broad walls of the waveguide substantially midway therebetween. The conductive connection will then not be coupled to the fundamental mode ($TE_{10}$) in the waveguide, and a substantial proportion of the height of the waveguide at said region may be unobstructed across the whole width of the waveguide (and in particular centrally between the narrow walls).

For biasing of the varactor diode, said conductive connection may be electrically coupled to said at least one of the narrow walls at R.F. but be electrically isolated therefrom at D.C. The other terminal of the varactor may then be conductively connected to the waveguide, for example at said one broad wall. As an alternative, said conductive connection need not be isolated from the narrow walls at D.C. but instead the other terminal of the varactor may be coupled to the waveguide at R.F. but be isolated therefrom at D.C.

In known configurations of varactor-tuned waveguide oscillators, a substantially linear variation of operating frequency with direct voltage across the varactor diode over at least the majority of the maximum operable range of variation of the capacitance of the varactor diode can be obtained only if the varactor is a hyperabrupt varactor. Surprisingly, it has been found that with waveguide oscillators embodying the invention, such a frequency/voltage characteristic may be obtainable with an abrupt tuning varactor diode.

An oscillator embodying the invention may further comprise a waveguide stub branched from the elongate portion of waveguide substantially at said region, the stub comprising means for varying the reactance presented thereby to the elongate portion of waveguide. This has the great advantage that the operating frequency can be changed with a substantially smaller effect on the extent of the electronic tuning range. Suitably, the stub impedance is effectively in series with the waveguide. To vary the reactance presented by the stub, the stub may be terminated with a movable short-circuit. The electronic tuning range may then be set by the position of the short-circuit termination of the main portion of waveguide and the operating frequency set, without greatly affecting the electronic tuning range, by the position of the short-circit termination of the stub. In an embodiment wherein the varactor diode extends into the waveguide from one broad wall thereof, the stub suitably is branched from the opposite broad wall.

BRIEF DESCRIPTION OF THE DRAWING

Embodiments of the invention will now be described, by way of example, with reference to the diagrammatic drawing, in which.

DESCRIPTION OF THE PREFERRED EMBODIMENTS

Figure 1:
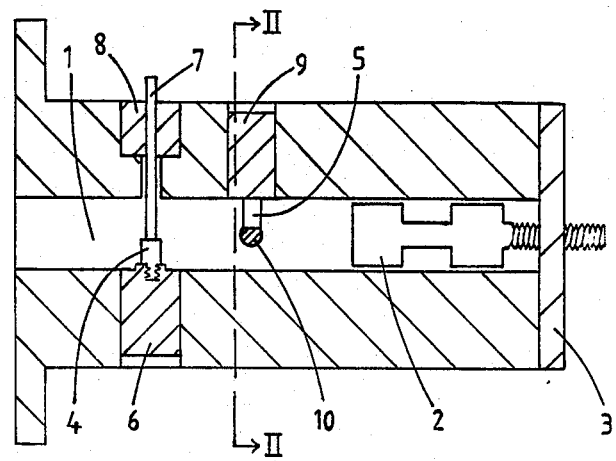
FIG. 1 is a longitudinal, partly sectional view of a first embodiment.
Figure 2:
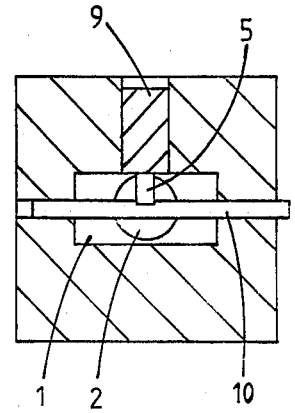
FIG. 2 is a cross-section on the line II—II in FIG. 1.

The embodiment shown in FIGS. 1 and 2 comprises an elongate portion of rectangular waveguide 1 terminated at one end by a standard form of waveguide non-contacting movable short-circuit 2. The short-circuit 2 is rotationally symmetrical about the longitudinal axis of the waveguide and comprises, in longitudinal succession, three sections of alternately larger and smaller diameter, each approximately a quarter wavelength long in the operating frequency range of the oscillator, and a threaded end section rotatably received in a threaded bore in an end plate 3 of the waveguide housing. The short-circuit can be secured in position by a lock-nut (not shown).

Spaced along the waveguide 1 from the short-circuit 2 and from one another are a Gunn diode 4 and a varactor diode 5, both mid-way between the narrow walls of the waveguide. The Gunn diode 4 is mounted on a cylindrical plug 6 which is secured (by means not shown) in a bore in the waveguide housing that extends to the lower broad wall of the waveguide. The lower terminal of the diode 4 is threadedly received in the plug 6, which also forms a heat-sink for the device, and is thereby conductively connected to the waveguide housing. Contact to the upper terminal of the Gunn diode is made by a conductive post 7 which is D.C.-isolated from the housing. The post is disposed in a bore in the housing that comprises a first, smaller-diameter portion extending from the upper broad wall of the waveguide over a distance which is approximately a quarter wavelength in the operating frequency range of the oscillator, and a second, larger-diameter portion further from the waveguide. The post 7 is supported in a bush 8 of microwave absorbent material received in the second bore portion and extends with clearance through the first bore portion into the waveguide.

The varactor diode 5 is secured between a cylindrical plug 9, which is secured (by means not shown) in a bore in the waveguide housing that extends to the upper broad wall of the waveguide, and a rod 10 of circular cross-section that extends transverse to the longitudinal axis of the waveguide and parallel to the broad walls of the waveguide, in this embodiment mid-way therebetween. The diode 5 is disposed in a recess in the rod 10 so dimensioned that the lower face of the plug 9 is flush with the upper broad wall of the waveguide. The ends of the rod 10 are supported in the waveguide housing: the rod is of aluminuim, and the portions of its surface engaging the housing are anodised so that the rod is isolated at D.C. but coupled at R.F. to the housing. A direct bias voltage can thus be applied to the lower terminal of the varactor diode via the rod 10, the upper terminal being conductively connected to the waveguide housing by the plug 9.

It will be appreciated that this arrangement for coupling the varactor diode to the waveguide extends over only part of the height of the waveguide, in contrast to the conventional post arrangement (as used in the above-mentioned known oscillator), whilst nevertheless permitting the varactor diode to be positioned mid-way between the narrow walls of the waveguide (to maximize the electronic tuning range obtainable with a suitable position of the short-circuit). This allows the operating frequency to be affected by adjustment of the short-circuit to a much greater extent than in the above-mentioned known oscillator wherein the varactor is between the Gunn diode and the short-circuit ("case2"), and consequently allows the extent of the electronic tuning range to be adjusted over a wide band of values, as will now be further explained.

In this embodiment, the spacing of the Gunn and varactor diodes 4 and 5 from one another, and of the varactor diode 5 from the short-circuit 2, is approximately half a wavelength in the operating frequency range of the oscillator; the spacing of the Gunn diode 4 from the short-circuit 2, which should be substantially an integral multiple (greater than one) of half a wavelength, is thus one wavelength in this case. When the short-circuit is positioned so that the effective electrical position of the varactor diode is mid-way between the Gunn diode and the short-circuit, the varactor diode will be at a minimum in the electromagnetic fields and the coupling of the varactor diode to the resonant cavity bounded by the Gunn diode and the short-circuit will be a minimum: consequently, the electronic tuning range will be minimal. As the short-circuit is moved, the operating frequency will change significantly because the Gunn diode can "see" the short-circuit termination, and the effective electrical spacing of the varactor diode from the Gunn diode will therefore progressively change from half a wavelength at the operating frequency, so that the varactor diode will be increasingly coupled to the fields in the resonant cavity and the electronic tuning range will increase correspondingly.

As an alternative to the above-described biasing arrangement for the varactor diode, the rod 10 may be conductively connected to the waveguide housing and the plug 9 may be isolated at D.C. from the housing and coupled thereto at R.F., for example by a thin insulating layer.

It is not necessary for the rod 10 to extend from the varactor diode to each of the narrow walls of the waveguide, but it may instead extend to only one of them. This may be particularly appropriate when the varactor is mounted closer to one of the narrow walls than the other (the maximum obtainable electronic tuning range not being required), in which case the rod may extend into the waveguide from that one narrow wall only as far as the varactor.

In addition or as an alternative to the movable short-circuit, the oscillator may comprise one or more dielectric tuning screws in the waveguide and/or tuning stubs (which may be reduced-height E-plane stubs with movable short-circuits) to vary the operating frequency of the oscillator and thus the effective electrical spacing, in terms of the wavelength at the operating frequency, of the variable reactance from the oscillator device. This spacing may be approximately equal to a higher integral multiple than one of half a wavelength, being for example approximately one wavelength; this may for example be the case when it is desired to include the above-mentioned additional or alternative tuning means and it is physically difficult or impossible to accommodate the various components sufficiently close together in terms of the wavelength in the operating frequency range (especially of course at high frequencies).

As indicated above, it is not essential for the varactor diode to be positioned mid-way between the narrow walls of the waveguide. If the varactor diode is offset from the central position, the maximum obtainable electronic tuning range will be less than with the varactor in the central position; nevertheless, an offset position may be preferable if the maximum electronic tuning range is not needed but it is instead desired to reduce the sensitivity of the extent of the tuning range to adjustments in the position of the short-circuit termination, so that a particular electronic tuning range may be more readily or accurately set by adjusting the short-circuit.

It is also possible for the varactor diode to be differently positioned with respect to the broad walls of the waveguide from the configuration described above with reference to FIGS. 1 and 2. For example, the diode may be wholly within the waveguide and spaced from the upper broad wall, with the lower terminal engaging the transverse member and contrast made to the upper terminal by a post extending thereto from the upper broad wall, or the diode may extend only partly into the waveguide and be partly recessed in the waveguide housing. As a further alternative, the diode may be wholly outside the waveguide and be coupled thereto by a coaxial line structure, the outer conductor of the coaxial line being formed by the waveguide housing and being connected to one terminal of the diode, while the inner conductor of the coaxial line is connected to the other terminal and extends into the waveguide to the transverse member.

The embodiment of FIGS. 1 and 2 has the disadvantage that the operating frequency cannot be altered substantially without also substantially changing the electronic tuning range: this is undesirable for applications in which an accurately defined tuning range is required with respect to a particular frequency of operation. This problem is alleviated with the embodiment of FIGS. 3 and 4. This embodiment comprises substantially the same elements as the embodiment of FIGS. 1 and 2 (as indicated by the same reference numerals), but additionally comprises a waveguide stub 11 which is branched from the main waveguide 1 at the region where the varactor diode 5 is coupled thereto; the stub 11 is operable to present a variable reactance to the waveguide 1, in this case by means of a movable short-circuit 12 of analogous configuration to the movable short-circuit 2. In this embodiment, the stub is an E-plane stub, i.e. a series stub, being branched from the lower broad wall of the waveguide, opposite the wall from which the varactor diode 5 extends.

In operation, adjustment of the short-circuit termination 12 of the stub causes the operating frequency to change while having little effect on the electronic tuning range. Thus the electronic tuning range may first be set by means of the short-circuit 2 terminating the main waveguide 1; the operating frequency can then be set by means of the short-circuit 12 terminating the stub 11. As with the first-described embodiment, this embodiment may comprise additional or alternative tuning means to the short-circuit 2, for example in order to provide fine tuning.

It is believed that the stub 11 functions as follows. The stub increases the effective length of the resonant cavity of the Gunn oscillator diode, thereby lowering the operating frequency. The stub being positioned at the same region of the waveguide 1 as the varactor diode, the increase in effective length of the resonant cavity provided by the stub can be apportioned substantially equally to the section of the waveguide 1 between the Gunn and varactor diodes and to the section of the waveguide 1 between the varactor diode and the short-circuit 2; this maintains the ratio of the effective electrical spacing between the Gunn and varactor diodes at the effective electrical length of the resonant cavity (this latter length controlling the operating frequency and wavelength) approximately constant as the position of the short-circuit termination 12 of the stub is adjusted, thus resulting in little change in the extent of coupling of the varactor diode to the electromagnetic fields in the cavity and hence in the electronic tuning range.

Figure 5:
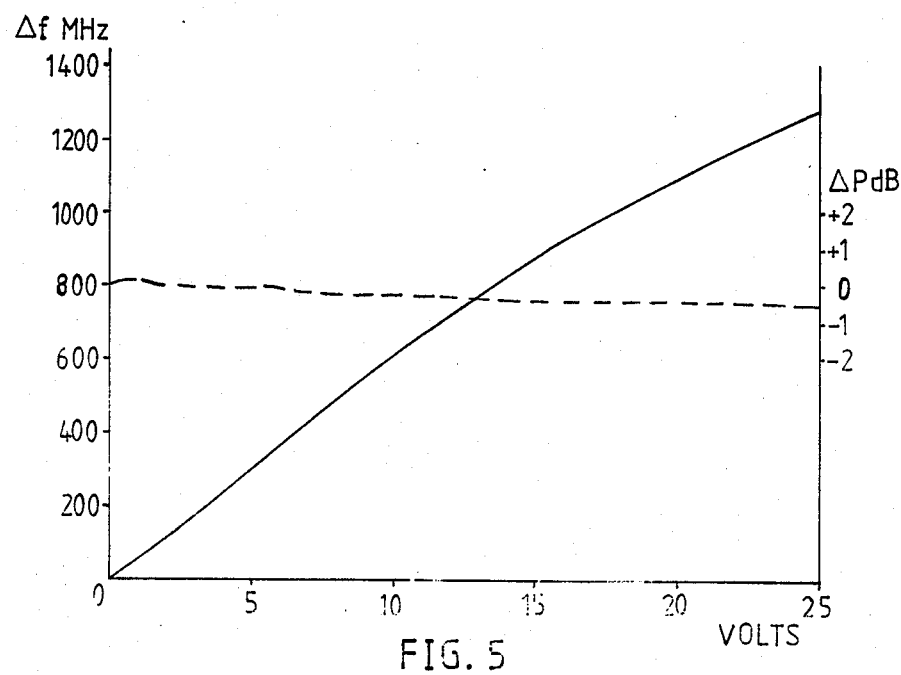
FIG. 5 is a graph showing the variation of frequency and output power with varactor bias voltage for an embodiment of the invention.

Experimental embodiments of the forms described with reference to the drawings have been constructed in waveguide size WG 22 (WR 28) for operation within the frequency range of 26.5–40.0 GHz (Q band). Microwave Associates varactors type MA 46600 J and GaAs abrupt p-n junction varactor chips in M 208 encapsulations were used; the Gunn diodes were various Microwave Associates and Mullard devices. It was found that electronic tuning ranges of 1 GHz or more could be readily obtained, and that with at least some of the varactors, the frequency/varactor bias voltage characteristics showed markedly less curvature than is usual with abrupt varactors (hyperabrupt varactors with carefully tailored junctions are normally required for a substantially linear characteristic); with a suitable mounting post arrangement for the Gunn diode, a characteristic which was substantially linear over at least a major part of the electronic tuning range could be obtained. It was also possible to obtain only a small variation in output power over a wide electronic tuning range. As usual, the output power and Q (quality factor) decreased as the electronic tuning range increased, with output powers typically in the range 50–150 mW. FIG. 5 is an example of a graph of measured change in output frequency, $\Delta f$ (solid line; left-hand scale), and measured change in output power, $\Delta P$ (dashed line; right-hand scale), against varactor bias voltage V. The frequency varied by nearly 1300 MHz as the bias voltage was changed from zero to 25 V, the variation being nearly linear, especially over the range of 0–15 V, whilst the output power changed by little more than ½ dB (in the graph, the 0 dB level is 54 mW).

Using as the transverse member 10 rods with various diameters in the range of 1.3–2.5 mm, it was found that the rate of change of frequency with varactor bias voltage and consequently the maximum obtainable electronic tuning range decreased as the diameter of the rod increased.

Figure 3:
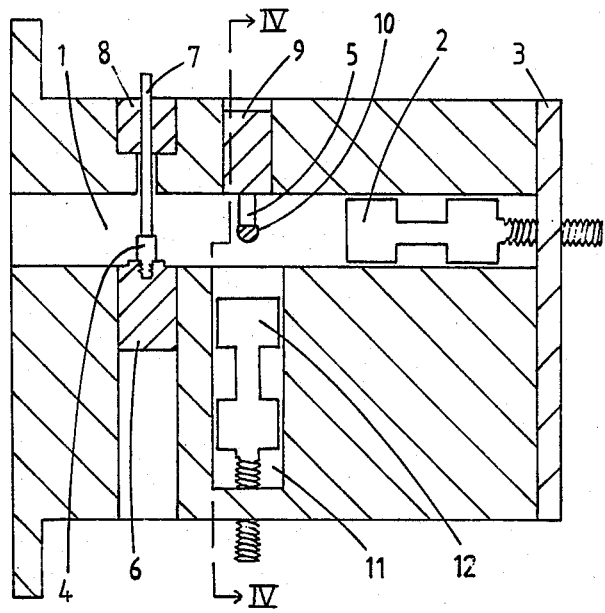
FIG. 3 is a longitudinal, partly sectional view of a second embodiment.
Figure 4:
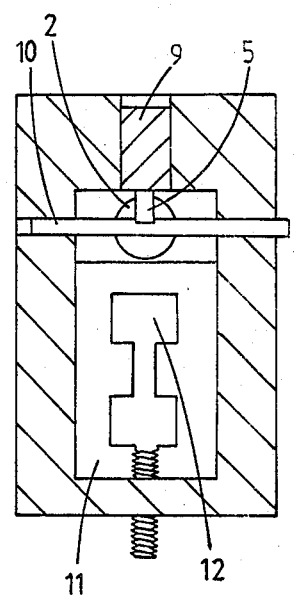
FIG. 4 is a cross-section on the line IV—IV in FIG. 3.

With embodiments of the form shown in FIGS. 3 and 4, it was found that by adjusting the stub short-circuit 12, the oscillators could be mechanically tuned over ranges of 2–3 GHz.

If the oscillator device in an embodiment of the invention is a relatively high-power, low-resistance device, it may be desirable for the waveguide to be of reduced rather than full height at least in the vicinity of the oscillator device in order to improve matching thereto.

I claim:

1. A tunable waveguide oscillator comprising an elongate portion of a rectangular waveguide having a termination at one end, a negative-resistance oscillator device positioned in the portion of the waveguide at a predetermined distance from said one end, means comprising a varactor diode for presenting an electrically variable reactance in the waveguide positioned in a region thereof between the oscillator device and the termination, and means for mechanically altering the effective electrical spacing, in terms of the wavelength in the waveguide at the operating frequency of the oscillator, between the oscillator device and said region, wherein in operation said spacing is approximately an integral number of half wavelengths, and wherein the variable reactance means extends into the waveguide over only part of the height of the waveguide at said region, measured perpendicular to the broad walls of the waveguide.

2. An oscillator as claimed in claim 1 wherein said termination and said means for mechanically altering said spacing comprise a movable short-circuit at said end.

3. An oscillator as claimed in claim 1 or 2 wherein the varactor diode extends into the waveguide from one broad wall thereof and wherein the variable reactance means further comprises a member providing an electrically conductive connection to a terminal of the varactor diode remote from said one broad wall and extending transversely to the waveguide from said terminal to at least one of the narrow walls of the waveguide.

4. An oscillator as claimed in claim 3 wherein said member extends substantially parallel to the broad walls of the waveguide and is disposed substantially mid-way therebetween.

5. An oscillator as claimed in claim 3 wherein said conductive connection is electrically coupled to said at least one of the narrow walls at R.F. but is electrically isolated therefrom at D.C.

6. An oscillator as claimed in claim 3 wherein the variation of operating frequency with direct voltage across the varactor diode is substantially linear over at least the majority of the maximum operable range of variation of the capacitance of the varactor diode and wherein the varactor diode is an abrupt tuning varactor diode.

7. An oscillator as claimed in claim 1 or 2 and further comprising a waveguide stub branched from the elongate portion of the waveguide substantially at said region, the stub comprising means for varying the reactance presented thereby to the elongate portion of waveguide.

8. An oscillator as claimed in claim 7 wherein said means for varying the reactance presented by the stub comprises a movable short-circuit termination of the stub.

9. An oscillator as claimed in claim 7 wherein the stub impedance is effectively in series with the elongate portion of waveguide.

10. An oscillator as claimed in claim 9 wherein the stub is branched from the broad wall of the waveguide opposite said one broad wall.

* * * * *